US011183994B1

United States Patent
Pan

(10) Patent No.: US 11,183,994 B1
(45) Date of Patent: Nov. 23, 2021

(54) DELAY CIRCUIT AND METHOD FOR USE IN REDUCING RELAY SWITCHING

(71) Applicant: CHANNEL WELL TECHNOLOGY CO., LTD., Taoyuan (TW)

(72) Inventor: Yi-An Pan, Taoyuan (TW)

(73) Assignee: CHANNEL WELL TECHNOLOGY CO., LTD., Taoyuan (TW)

( * ) Notice: Subject to any disclaimer, the term of this patent is extended or adjusted under 35 U.S.C. 154(b) by 0 days.

(21) Appl. No.: 17/117,112

(22) Filed: Dec. 10, 2020

(30) Foreign Application Priority Data

Aug. 5, 2020 (TW) .................................. 109126558

(51) Int. Cl.
*H03K 5/13* (2014.01)
*H03K 5/00* (2006.01)

(52) U.S. Cl.
CPC ..... *H03K 5/13* (2013.01); *H03K 2005/00163* (2013.01)

(58) Field of Classification Search
CPC ....................... H03K 5/13; H03K 2005/00163
USPC .......................................................... 327/285
See application file for complete search history.

(56) References Cited

U.S. PATENT DOCUMENTS

| 3,441,810 | A | * | 4/1969 | Richard | H03K 5/13 |
| | | | | | 361/198 |
| 3,575,639 | A | * | 4/1971 | Shaw | H03K 17/28 |
| | | | | | 361/196 |
| 3,651,371 | A | * | 3/1972 | Tingley | H03B 9/10 |
| | | | | | 315/102 |
| 2010/0084918 | A1 | * | 4/2010 | Fells | H02J 50/60 |
| | | | | | 307/32 |
| 2014/0366829 | A1 | * | 12/2014 | Wu | F02N 11/10 |
| | | | | | 123/179.3 |

* cited by examiner

*Primary Examiner* — Ryan Jager

(57) ABSTRACT

A delay circuit is disclosed. The delay circuit is coupled to a relay switch that is contained in a power conversion device. When an electronic device having the power conversion device is operated in a sleep mode, the delay circuit applies a time delaying process to a power signal that is transmitted to the relay switch, such that a rising time of each of switch-on pulses contained by the power signal is delayed for a specific time. The specific time is set to be longer than a pulse width of each of power-on pulses contained by a power switching signal of the power conversion device. As such, when the electronic device is operated in the sleep mode, switching actions of the relay switch is properly controlled, thereby making the power conversion device not produce noise. Moreover, the service life of the relay unit is also extended.

11 Claims, 6 Drawing Sheets

DELAY CIRCUIT AND METHOD FOR USE IN REDUCING RELAY SWITCHING

BACKGROUND OF THE INVENTION

1. Field of the Invention

The present invention relates to the technology field of delay circuits, and more particularly to a delay circuit and method for use in reducing relay switching.

2. Description of the Prior Art

Nowadays, power supply device is known a necessary part of an electronic device. FIG. 1 illustrates a block diagram of a conventional power supply device. As FIG. 1 shows, the power supply device 1' mainly comprises a bridge rectifier 11', an input capacitor Cin' and a DC-DC converter 12', wherein the bridge rectifier 11' is used for applying a signal rectifying process to an AC signal that is transmitted from an AC power source 2'. Moreover, the input capacitor Cin' is used to applying a signal filtering process to a pulsating DC signal that is transmitted from the bridge rectifier 11', thereby outputting a DC signal to the DC-DC converter 12'. It is worth mentioning that, the input capacitor Cin' transiently becomes a short circuit at an instant of the power supply device 1' being turned ON, such that an inrush current is produced so as to cause the electronic components of the electronic device 3' and/or the DC-DC converter 12' be broken. In view of that, the power supply device 1' is further integrated with an inrush current suppression unit. FIG. 1 depicts that the inrush current suppression unit comprises a thermistor 13' and a relay switch 14'. By such arrangement, it is able to use a power signal $V_{CCO}$ to control the relay switch 14' to switch between a switch-on state and a switch-off state. After the inrush current is suppressed by the thermistor 13', the relay switch 14' is operated at the switch-on state, so as to make the thermistor 13' become an open circuit, such that the thermistor 13' is prevented from being a principal power-consuming component during a normal operation of the power supply device 1'.

With awareness of energy conservation, reducing power consumption of electronic device is hence become an important issue. Advanced configuration and power interface (ACPI) is defined and proposed by Intel Corporation, which is applied in an electronic device like computer for power mode management. ACPI does not specify particular power management mechanisms; instead, it defines levels of power management as global power states, including mechanical off state (G3), soft off state (G2), sleep state (G1), and working state (G0). FIG. 2 illustrates a timing diagram of a power switching signal and a power signal ($V_{CCO}$). As FIG. 1 and FIG. 2 show, in case of the electronic device 3' is operated at a sleep mode (G1), operation system (OS) of the electronic device 3' would wake up the power supply device 1' once every 180 seconds, for letting the power supply device 1' be switched ON for 1 second. Therefore, as FIG. 2 shows, the relay switch is controlled by the power signal $V_{CCO}$, and is operated at the switch-on state for 1 second after there is a power-on pulse occurred on the power signal $V_{CCO}$ for 150 ms.

However, practical experience reveals that, in case of the electronic device 3' being operated at the sleep mode for a very long time, the relay unit 14' is controlled by the (PWM) power signal $V_{CCO}$ so as to be switched between the switch-on state and the switch-off state alternately and constantly, thereby not only does a lot of noise be produced, but the product service life of the relay switch 14' is also reduced.

From above descriptions, it is clear that there is a room for improvement in the conventional relay switch controlling method. In view of that, inventors of the present application have made great efforts to make inventive research and eventually provided a delay circuit and method for use in reducing relay switching.

SUMMARY OF THE INVENTION

The primary objective of the present invention is to disclose a delay circuit, which is applied in a power conversion device and is for use in reducing relay switching. The delay circuit is coupled to a relay switch, and comprises: a first diode, a second diode, a BJT element, and a delay unit. According to the particular design of the present invention, in case of an electronic device having the power conversion device is operated in a sleep mode, the delay unit applies a time delaying process to a power signal ($V_{CCO}$) that is transmitted to the relay switch, such that a rising time of each of switch-on pulses contained by the power signal is delayed for a specific time. The specific time is longer than a pulse width of each of power-on pulses contained by a power switching signal of the power conversion device. As such, when the electronic device is operated in the sleep mode, switching actions of the relay switch is properly controlled, thereby making the power conversion device not produce noise. Moreover, the product service life of the relay unit is also extended.

In order to achieve the primary objective of the present invention, inventors of the present invention provides one embodiment for the delay circuit, which is applied in a power conversion device containing a relay unit, and comprising:

a first terminal, being coupled to a first coil terminal of a relay coil of the relay unit;

a second terminal, being coupled to a second coil terminal of the relay coil of the relay unit;

a third terminal, being coupled to a reference ground;

a first diode, being coupled to the second terminal by a cathode end thereof, and being coupled to a power signal by an anode end thereof;

a second diode, being coupled to the first terminal by an anode end thereof, and being coupled to a first common connection node of the second terminal and the cathode end of the first diode by a cathode end thereof;

a BJT element, having an emitter terminal, a collector terminal and a base terminal, wherein the emitter terminal is coupled to the reference ground, and the collector terminal being coupled to a second common connection node of the first terminal and the anode end of the second diode; and a delay unit, being coupled between the base terminal of the BJT element, the reference ground RG and the first common connection node;

wherein in case an electronic device having the power conversion device being operated in a sleep mode, the delay unit applies a time delaying process to the power signal that is transmitted to the second coil terminal of the relay coil, such that a rising time of each of switch-on pulses contained by the power signal is delayed for a specific time;

wherein the specific time is equal to or longer than a pulse width of each of power-on pulses contained by a power switching signal of the power conversion device.

Moreover, inventors of the present invention also provides one embodiment for the delay method, which is implemented in a power conversion device containing a relay unit by including a relay circuit into the power conversion device, and comprising following steps:

(1) letting the relay circuit receive a power signal that is transmitted to a relay coil of the relay unit;

(2) in case an electronic device having the power conversion device being operated in a sleep mode, applying a time delaying process to the power signal by the delay unit, thereby making a rising time of each of switch-on pulses contained by the power signal be delayed for a specific time; wherein the specific time is equal to or longer than a pulse width of each of power-on pulses contained by a power switching signal of the power conversion device.

In the embodiment of the forgoing delay circuit, the pulse width of the power-on pulse is 1 second, and the specific time being equal to or longer than 1 second.

In the embodiment of the forgoing delay circuit, the BJT element is a NPN BJT element.

In the embodiment of the forgoing delay circuit, the delay unit comprises:

a Zener diode, being coupled to the base terminal of the BJT element by an anode end thereof;

a time-delaying resistor, being coupled to a cathode end of the Zener diode by a first end thereof, and being coupled to the first common connection node by a second end thereof;

a fourth diode, being coupled to a third common connection node of the first end of the time-delaying resistor and the cathode end of the Zener diode by an anode end thereof, and being coupled to the second end of the time-delaying resistor by a cathode end thereof; and a time-delaying capacitor, being coupled between the reference ground and the third common connection node;

wherein a RC time constant is generated by multiplying a resistance of the time-delaying resistor by a capacitance of the time-delaying capacitor, and the RC time constant being greater than 1 second.

In the embodiment of the forgoing delay circuit, the delay unit comprises a microcontroller that is coupled between the base terminal of the BJT element, the reference ground and the first common connection node.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a delay circuit and method for use in reducing relay switching disclosed by the present invention, embodiments of the present invention will be described in detail with reference to the attached drawings hereinafter.

First Embodiment

Figure 1:
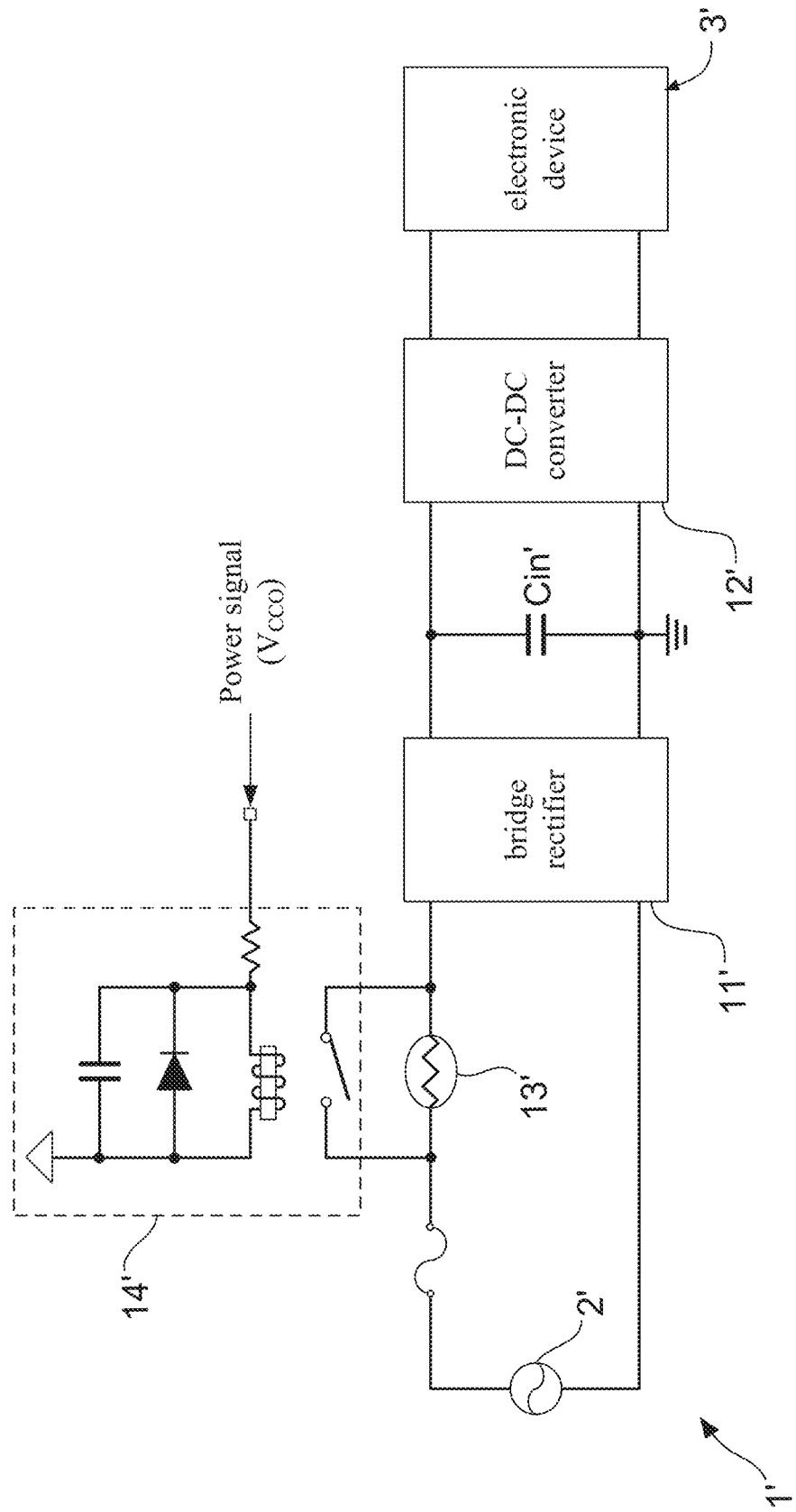
FIG. 1 shows a block diagram of a conventional power supply device.
Figure 2:
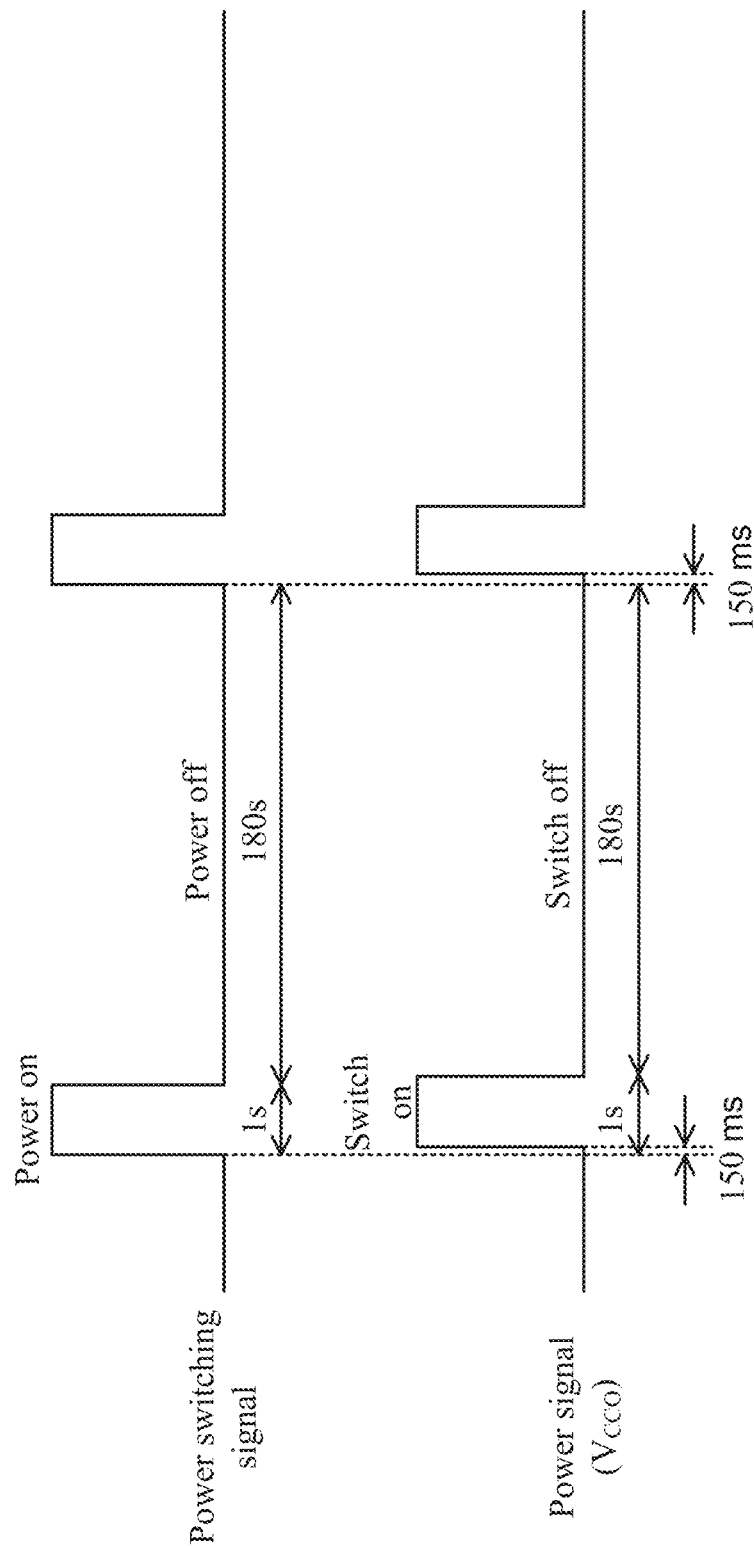
FIG. 2 shows a timing diagram of a power switching signal and a power signal (VCCO)
Figure 3:
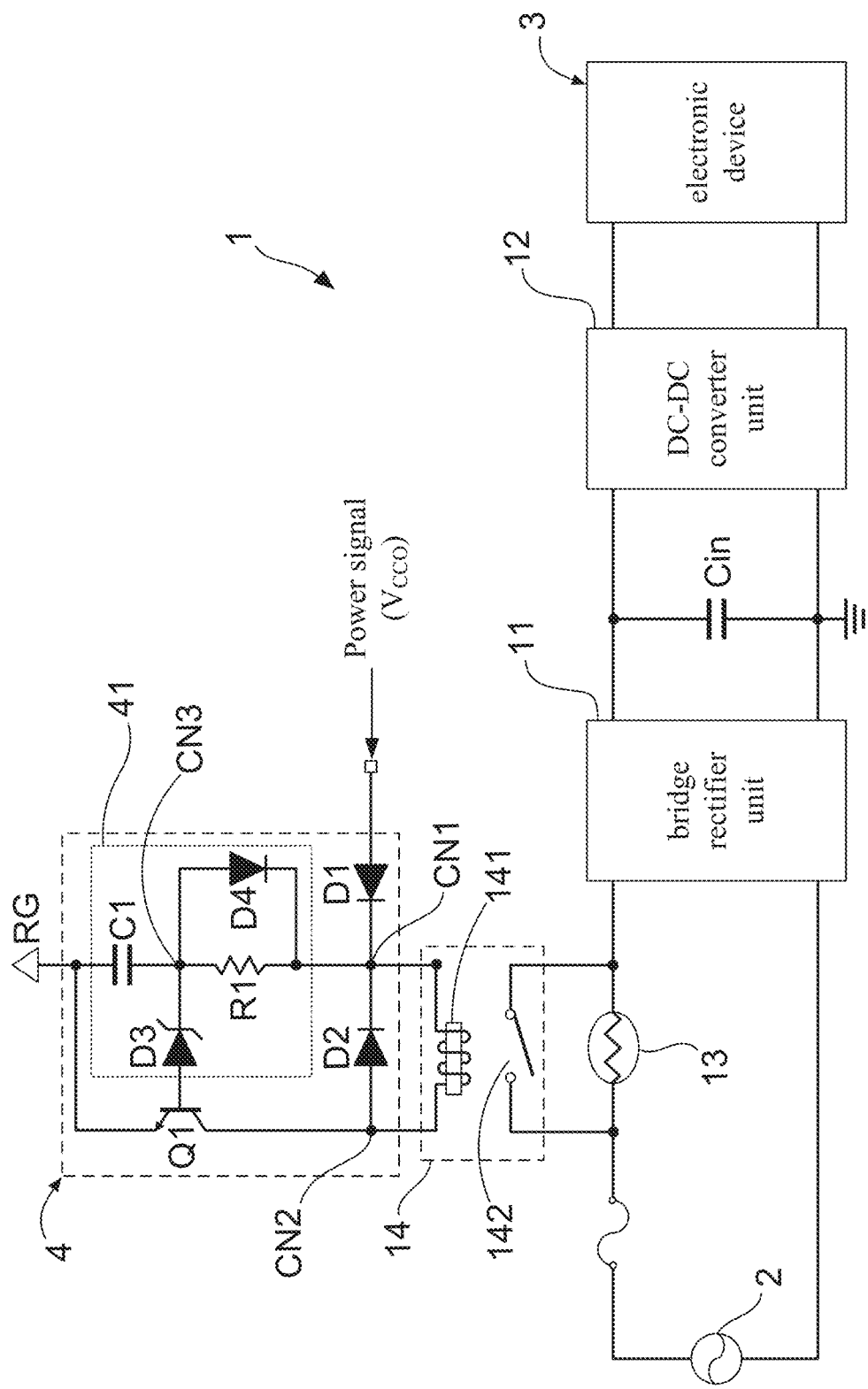
FIG. 3 shows a first block diagram of a conventional power supply device that includes a delay circuit according to the present invention.

With reference to FIG. 3, there is shown a first block diagram of a conventional power supply device that includes a delay circuit according to the present invention. As FIG. 3 shows, the delay circuit 4 is applied in a power conversion device 1, and the power conversion device 1 comprises: a bridge rectifier 11, an input capacitor Cin, a DC-DC converter 12, and an inrush current suppression unit consisting of a thermistor 13 and a relay switch 14. Moreover, the delay circuit 4 of the present invention principally comprises: a first terminal, a second terminal, a third terminal, a first diode D1, a second diode D2, a BJT element Q1, and a delay unit 41.

The first terminal is coupled to a first coil terminal of a relay coil 141 of the relay unit 14, the second terminal is coupled to a second coil terminal of the relay coil 141 of the relay unit 14, and the third terminal is coupled to a reference ground RG. As described in more detail below, the first diode D1 is coupled to the second terminal by a cathode end thereof, and is coupled to a power signal ($V_{CCO}$) by an anode end thereof. Moreover, the second diode D2 is coupled to the first terminal by an anode end thereof, and is coupled to a first common connection node CN1 of the second terminal and the cathode end of the first diode D1 by a cathode end thereof. On the other hand, the BJT element Q1 has an emitter terminal, a collector terminal and a base terminal, wherein the emitter terminal is coupled to the reference ground RG, and the collector terminal is coupled to a second common connection node CN2 of the first terminal and the anode end of the second diode D2. In addition, the delay unit 4 is coupled between the base terminal of the BJT element Q1, the reference ground RG and the first common connection node CN1.

By such arrangement, when an electronic device 3 having the power conversion device 1 is operated in a sleep mode, the delay unit 4 applies a time delaying process to the power signal ($V_{CCO}$) that is transmitted to the second coil terminal of the relay coil 141, such that a rising time of each of switch-on pulses contained by the power signal ($V_{CCO}$) is delayed for a specific time. Particularly, the specific time is set to be equal to or longer than a pulse width of each of power-on pulses contained by a power switching signal of the power conversion device 1.

Figure 4:
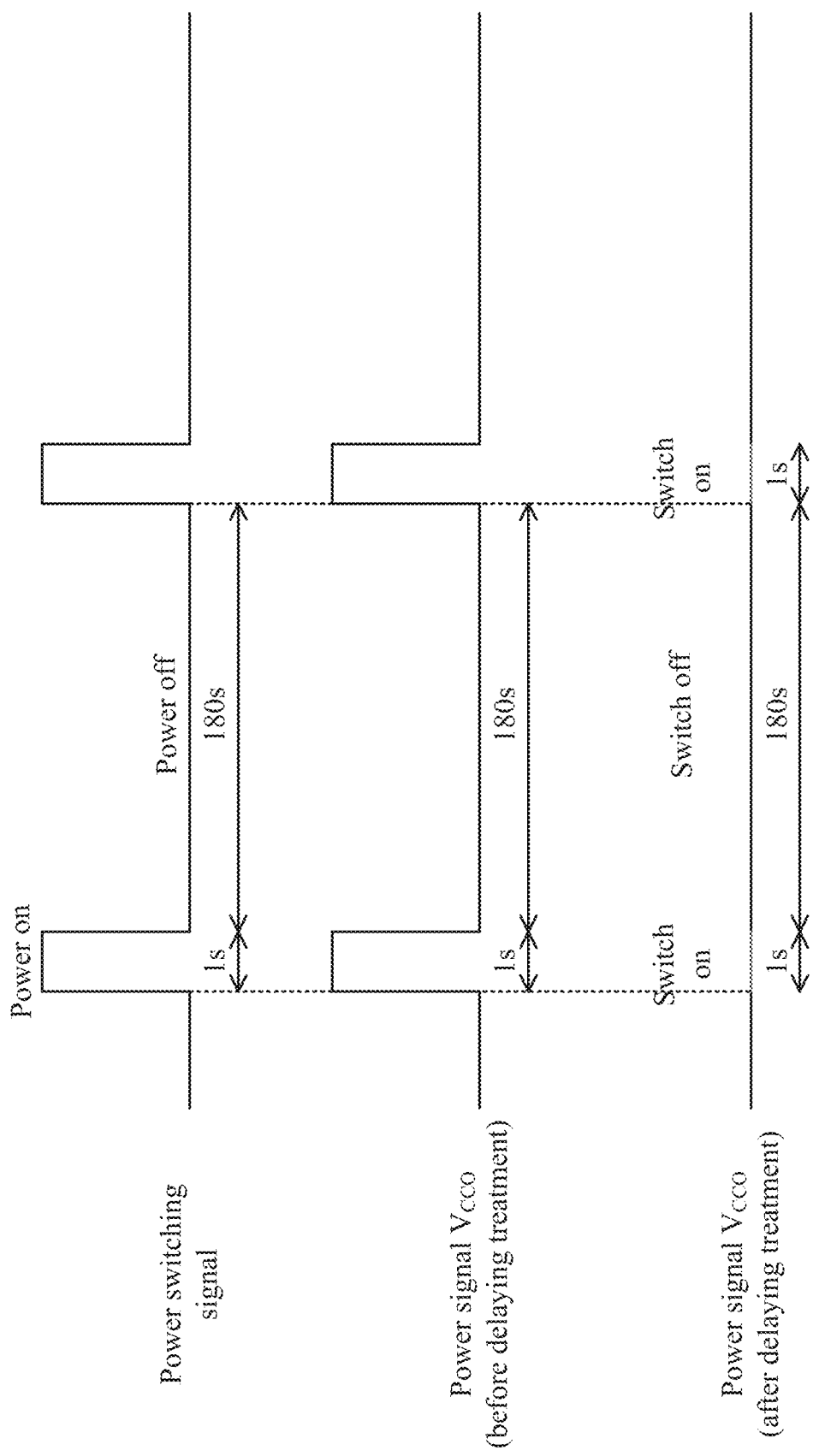
FIG. 4 shows a timing diagram of a power switching signal, a power signal (before delaying treatment) and a power signal (after delaying treatment)

In one practicable embodiment, the pulse width of the power-on pulse is 1 second, and the specific time is set to be equal to or longer than 1 second. FIG. 4 shows a timing diagram of a power switching signal, a power signal (before delaying treatment) and a power signal (after delaying treatment). It is worth noting that, before being applied with the time delaying process, the each of the switch-on pulses contained by the power signal ($V_{CCO}$) is corresponding to each of the power-on pulses contained by the power switching signal of the power conversion device 1. However, after being applied with the time delaying process, a rising time the switch-on pulse on the power signal ($V_{CCO}$) is delayed for 1 second. As such, before a rising edge of the switch-on pulse on the power signal ($V_{CCO}$) occurs, the power-on pulse corresponding to the switch-on pulse has passed and ended its time of pulse width.

Briefly speaking, after being applied with the time delaying process, the power signal ($V_{CCO}$) transmitted to the relay coil 141 of the relay switch 14 does not include any switch-on pulses. In other words, when the electronic device 3 is operated in the sleep mode, switching actions of the relay switch 14 is properly controlled because the relay switch 14 is constantly operated at a switch-off state, thereby making the power conversion device 1 not produce noise. Moreover, the product service life of the relay unit 14 is also extended.

In one practicable embodiment, the BJT element Q1 is a NPN BJT element, and the delay unit 41 is an analog circuit consisting of a Zener diode D3, a time-delaying resistor R1, a fourth diode D4, and a time-delaying capacitor C1. The Zener diode D3 is coupled to the base terminal of the BJT element Q1 by an anode end thereof. Moreover, the time-delaying resistor R1 is coupled to a cathode end of the Zener diode D3 by a first end thereof, and is coupled to the first common connection node CN1 by a second end thereof. On the other hand, the fourth diode D4 is coupled to a third common connection node of the first end of the time-delaying resistor R1 and the cathode end of the Zener diode D3 by an anode end thereof, and is coupled to the second end of the time-delaying resistor R1 by a cathode end thereof. FIG. 3 also depicts that the time-delaying capacitor C1 is coupled between the reference ground RG and the third common connection node. From the circuit diagram of FIG. 3, it is understood that a RC time constant is generated by multiplying a resistance of the time-delaying resistor R1 by a capacitance of the time-delaying capacitor C1. According to the present invention, the RC time constant is set to be greater than 1 second. For example, after letting the time-delaying resistor R1 has a resistance of 100 KΩ and letting the time-delaying capacitor C1 has a capacitance of 100 μF, the RC time constant is $100 \times 10^3 \times 10 \times 10^{-6} = 1$ second.

First Embodiment

Figure 5:
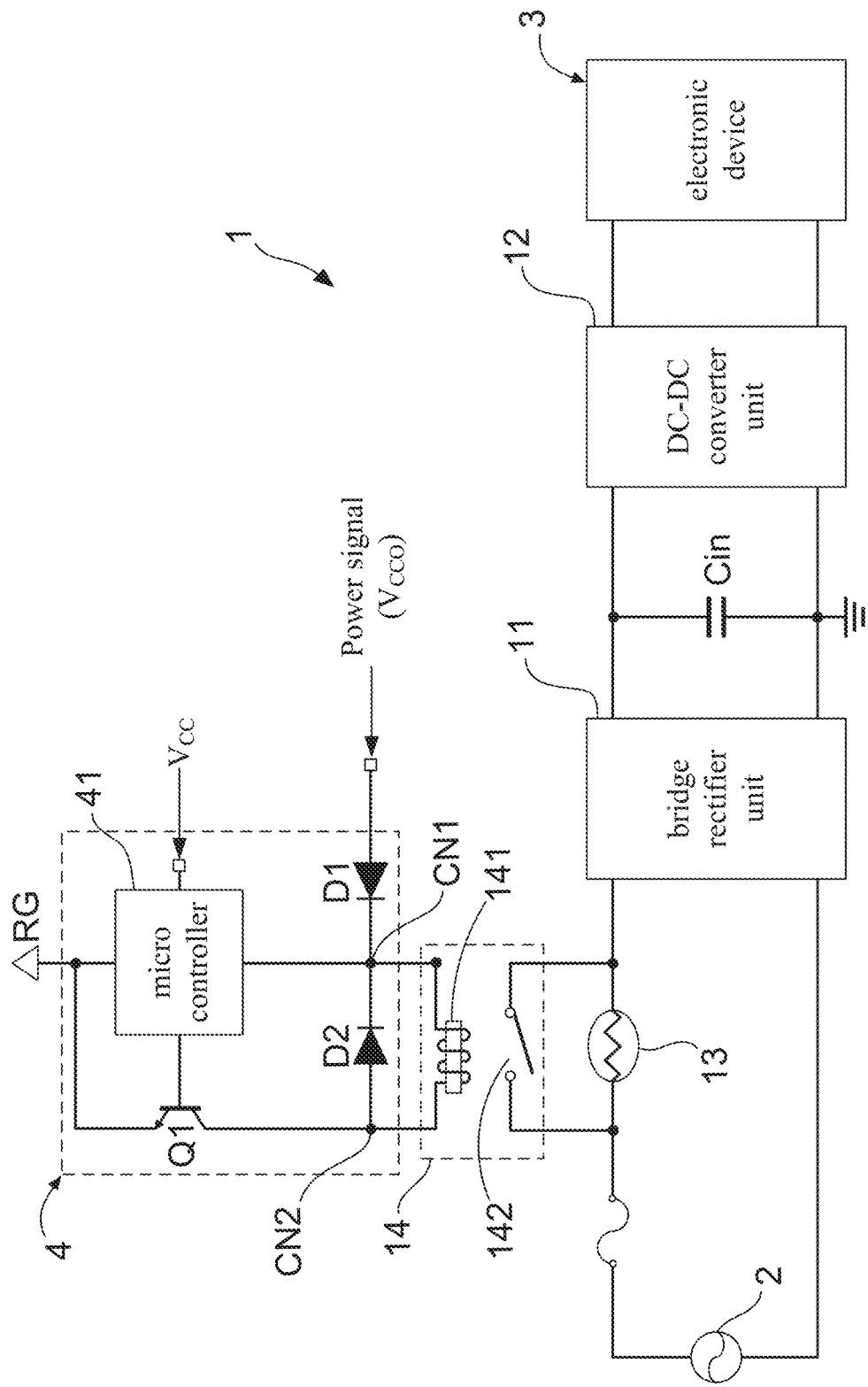
FIG. 5 shows a second block diagram of a conventional power supply device that includes a delay circuit according to the present invention.

With reference to FIG. 5, there is shown a second block diagram of a conventional power supply device that includes a delay circuit according to the present invention. In second embodiment, the delay circuit 4 of the present invention also comprises: a first terminal, a second terminal, a third terminal, a first diode D1, a second diode D2, a BJT element Q1, and a delay unit 41. However, the delay unit 41 comprises a microcontroller that is coupled between the base terminal of the BJT element Q1, the reference ground RG and the first common connection node CN1. It is easy to know that, by embedding a delay algorithm or library into the microcontroller, the microcontroller would automatically apply a time delaying process to the power signal ($V_{CCO}$) in case of an electronic device 3 having the power conversion device 1 is operated in a sleep mode as well as a power signal ($V_{CCO}$) is transmitted to a relay coil 141 of the relay unit 14. As a result, a rising time of each of switch-on pulses contained by the power signal (VCCO) is delayed for a specific time. Particularly, the specific time is set to be equal to or longer than a pulse width of each of power-on pulses contained by a power switching signal of the power conversion device 1.

As FIG. 4 shows, after being applied with the time delaying process, the power signal ($V_{CCO}$) transmitted to the relay coil 141 of the relay switch 14 does not include any switch-on pulses. In other words, when the electronic device 3 is operated in the sleep mode, switching actions of the relay switch 14 is properly controlled because the relay switch 14 is constantly operated at a switch-off state, thereby making the power conversion device 1 not produce noise. Moreover, the product service life of the relay unit 14 is also extended.

Figure 6:
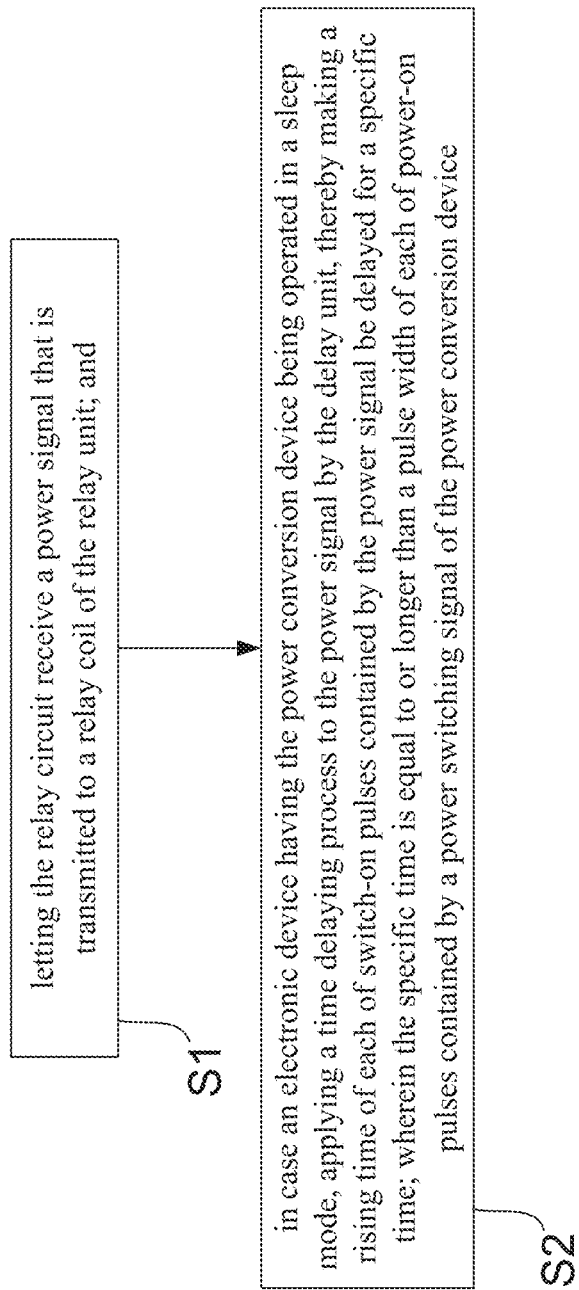
FIG. 6 shows a flowchart diagram of a delay method according to the present invention.

Moreover, the present invention simultaneously proposes a delay method, which is implemented in a power conversion device 1 containing a relay unit 14 by including a relay circuit 4 into the power conversion device 1. FIG. 6 shows a flowchart diagram of a delay method according to the present invention. As FIG. 6 shows, the delay method of the present invention principally comprises following steps:

S1: letting the relay circuit 4 receive a power signal (VCCO) that is transmitted to a relay coil of the relay unit 14; and S2: in case an electronic device 3 having the power conversion device 1 being operated in a sleep mode, applying a time delaying process to the power signal (VCCO) by the delay unit 4, thereby making a rising time of each of switch-on pulses contained by the power signal (VCCO) be delayed for a specific time; wherein the specific time is equal to or longer than a pulse width of each of power-on pulses contained by a power switching signal of the power conversion device 1.

Therefore, through above descriptions, all embodiments and their constituting elements of the a delay circuit for use in reducing relay switching; in summary, the present invention includes the advantages of:

(1) The present invention discloses a disclose a delay circuit 4, which is applied in a power conversion device 1 having a relay unit 14, and is for use in reducing relay switching. The delay circuit 4 is coupled to the relay switch 14, and comprises: a first diode D1, a second diode D2, a BJT element Q1, and a delay unit 41. According to the particular design of the present invention, in case of an electronic device 3 having the power conversion device 1 is operated in a sleep mode, the delay unit 41 applies a time delaying process to a power signal ($V_{CCO}$) that is transmitted to the relay switch 14, such that a rising time of each of switch-on pulses contained by the power signal ($V_{CCO}$) is delayed for a specific time. The specific time is longer than a pulse width of each of power-on pulses contained by a power switching signal of the power conversion device 1. As such, when the electronic device 3 is operated in the sleep mode, switching actions of the relay switch 14 is properly controlled, thereby making the power conversion device 1 not produce noise. Moreover, the product service life of the relay unit 14 is also extended.

The above description is made on embodiments of the present invention. However, the embodiments are not intended to limit scope of the present invention, and all equivalent implementations or alterations within the spirit of the present invention still fall within the scope of the present invention.

What is claimed is:

1. A delay circuit, being applied in a power conversion device containing a relay unit, and comprising:
    a first terminal, being coupled to a first coil terminal of a relay coil of the relay unit;
    a second terminal, being coupled to a second coil terminal of the relay coil of the relay unit;
    a third terminal, being coupled to a reference ground;

a first diode, being coupled to the second terminal by a cathode end thereof, and being coupled to a power signal by an anode end thereof;

a second diode, being coupled to the first terminal by an anode end thereof, and being coupled to a first common connection node of the second terminal and the cathode end of the first diode by a cathode end thereof;

a BJT element, having an emitter terminal, a collector terminal and a base terminal, wherein the emitter terminal is coupled to the reference ground, and the collector terminal being coupled to a second common connection node of the first terminal and the anode end of the second diode; and a delay unit, being coupled between the base terminal of the BJT element, the reference ground and the first common connection node;

wherein in case an electronic device having the power conversion device being operated in a sleep mode, the delay unit applies a time delaying process to the power signal) that is transmitted to the second coil terminal of the relay coil, such that a rising time of each of switch-on pulses contained by the power signal is delayed for a specific time;

wherein the specific time is equal to or longer than a pulse width of each of power-on pulses contained by a power switching signal of the power conversion device.

2. The delay circuit of claim 1, wherein the pulse width of the power-on pulse is 1 second, and the specific time being equal to or longer than 1 second.

3. The delay circuit of claim 1, wherein the BJT element is a NPN BJT element.

4. The delay circuit of claim 2, wherein the delay unit comprises:

a Zener diode, being coupled to the base terminal of the BJT element by an anode end thereof;

a time-delaying resistor, being coupled to a cathode end of the Zener diode by a first end thereof, and being coupled to the first common connection node by a second end thereof;

a fourth diode, being coupled to a third common connection node of the first end of the time-delaying resistor and the cathode end of the Zener diode by an anode end thereof, and being coupled to the second end of the time-delaying resistor by a cathode end thereof; and a time-delaying capacitor, being coupled between the reference ground and the third common connection node;

wherein a RC time constant is generated by multiplying a resistance of the time-delaying resistor by a capacitance of the time-delaying capacitor, and the RC time constant being greater than 1 second.

5. The delay circuit of claim 1, wherein the delay unit comprises a microcontroller that is coupled between the base terminal of the BJT element, the reference ground and the first common connection node.

6. A delay method, being implemented in a power conversion device containing a relay unit by including a relay circuit into the power conversion device, and comprising following steps:

(1) letting the relay circuit receive a power signal that is transmitted to a relay coil of the relay unit; and (2) in case an electronic device having the power conversion device being operated in a sleep mode, applying a time delaying process to the power signal by the delay unit, thereby making a rising time of each of switch-on pulses contained by the power signal be delayed for a specific time; wherein the specific time is equal to or longer than a pulse width of each of power-on pulses contained by a power switching signal of the power conversion device.

7. The delay method of claim 6, wherein the pulse width of the power-on pulse is 1 second, and the specific time being equal to or longer than 1 second.

8. The delay method of claim 7, wherein the delay circuit comprises:

a first terminal, being coupled to a first coil terminal of the relay coil of the relay unit;

a second terminal, being coupled to a second coil terminal of the relay coil of the relay unit;

a third terminal, being coupled to a reference ground;

a first diode, being coupled to the second terminal by a cathode end thereof, and being coupled to a power signal by an anode end thereof;

a second diode, being coupled to the first terminal by an anode end thereof, and being coupled to a first common connection node of the second terminal and the cathode end of the first diode by a cathode end thereof;

a BJT element, having an emitter terminal, a collector terminal and a base terminal, wherein the emitter terminal is coupled to the reference ground, and the collector terminal being coupled to a second common connection node of the first terminal and the anode end of the second diode; and a delay unit, being coupled between the base terminal of the BJT element, the reference ground and the first common connection node;

wherein in case the electronic device having the power conversion device being operated in the sleep mode, the delay unit applies the time delaying process to the power signal that is transmitted to the second coil terminal of the relay coil, such that the rising time of the switch-on pulse is delayed for the specific time.

9. The delay method of claim 8, wherein the BJT element is a NPN BJT element.

10. The delay method of claim 8, wherein the delay unit comprises:

a Zener diode, being coupled to the base terminal of the BJT element by an anode end thereof;

a time-delaying resistor, being coupled to a cathode end of the Zener diode by a first end thereof, and being coupled to the first common connection node by a second end thereof;

a fourth diode, being coupled to a third common connection node of the first end of the time-delaying resistor and the cathode end of the Zener diode by an anode end thereof, and being coupled to the second end of the time-delaying resistor by a cathode end thereof; and a time-delaying capacitor, being coupled between the reference ground and the third common connection node;

wherein a RC time constant is generated by multiplying a resistance of the time-delaying resistor by a capacitance of the time-delaying capacitor, and the RC time constant being greater than 1 second.

11. The delay method of claim 8, wherein the delay unit comprises a microcontroller that is coupled between the base terminal of the BJT element, the reference ground and the first common connection node.

* * * * *